(12) United States Patent
Yang et al.

(10) Patent No.: US 6,606,727 B1
(45) Date of Patent: Aug. 12, 2003

(54) SYSTEM AND METHOD FOR PROVIDING ERROR CORRECTION CODING WITH SELECTIVELY VARIABLE REDUNDANCY

(75) Inventors: Honda Yang, Saratoga, CA (US); John T. Gill, III, Stanford, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/429,065

(22) Filed: Oct. 29, 1999

(51) Int. Cl.⁷ .............................................. H03M 13/00
(52) U.S. Cl. ....................................... 714/774; 714/784
(58) Field of Search ................................ 714/755, 756, 714/769, 770, 774, 784

(56) References Cited

U.S. PATENT DOCUMENTS

| | | | | |
|---|---|---|---|---|
| 4,849,976 A | * | 7/1989 | Schilling et al. | 714/751 |
| 5,285,455 A | * | 2/1994 | Tong et al. | 714/756 |
| 5,392,299 A | * | 2/1995 | Rhines et al. | 714/755 |
| 5,778,011 A | * | 7/1998 | Blaum et al. | 714/755 |
| 5,838,696 A | * | 11/1998 | Mons | 714/752 |
| 5,872,798 A | * | 2/1999 | Baggen et al. | 714/755 |
| 6,041,431 A | * | 3/2000 | Goldstein | 714/756 |
| 6,378,105 B1 | * | 4/2002 | Chiang | 714/784 |

OTHER PUBLICATIONS

Saxena, N.R. McCluskey, E.J.; Analysis of checksums, extended–precision checksums, and cyclic redundancy checks; IEEE Transactions on Computers, vol.: 39 Issue: 7, Jul. 1990 pp.: 969–975.*

Rankin, D. and Gulliver, T.A.; Randomly interleaved single parity check product codes; 1999 IEEE Pacific Rim Conference on Communications, Computers and Signal Processing, pp.: 420–423.*

Roth, R.M. and Seroussi, G.; Reduced–redundancy product codes for burst error correction; IEEE Transactions on Information Theory, vol.: 44 Issue: 4, Jul. 1998 pp.: 1395–1406.*

* cited by examiner

*Primary Examiner*—Albert Decady
*Assistant Examiner*—Joseph D. Torres
(74) *Attorney, Agent, or Firm*—Lisa K. Jorgenson; Andre Szuwalski

(57) ABSTRACT

A system and method are disclosed for providing error correction coding having a selectively variable degree of redundancy. The system and method include generating extended check symbols by performing a Reed-Solomon operation on unused check symbols that do not form a portion of an interleaved code word. An extended check symbol is generated from the unused check symbols appearing in a column of the unused check symbols. The extended check symbols are stored with the interleaved code words in a data storage device. The extended check symbols are retrieved from the data storage device with the corresponding interleaved code words. Following the decoding of the interleaved code words and the identification of uncorrectable errors therein, the extended check symbols are decoded to recover the corresponding unused check symbols for the previously uncorrectable interleaved code words. The recovered unused check symbols are added to the previously uncorrectable interleaved code words so as to increase the error correcting capability thereof. The previously uncorrectable interleaved code words having the recovered unused check symbols are then decoded and errors therein corrected accordingly.

45 Claims, 6 Drawing Sheets

SYSTEM AND METHOD FOR PROVIDING ERROR CORRECTION CODING WITH SELECTIVELY VARIABLE REDUNDANCY

BACKGROUND OF THE INVENTION

1. Technical Field of the Invention

The present invention relates to a Reed-Solomon error correction code, and particularly to a system and method for providing an interleaved error correction code having selectively variable redundancy.

2. Background of the Invention

Existing data storage devices, such as disk drives, utilize Reed-Solomon error correcting codes to perform burst error correction and to achieve higher areal densities. The capability to correct multiple error bursts in near real time is necessary to minimize error recovery time and avoid the interruption of data flow.

Because magnetic data storage devices tend to generate errors in bursts, data stored on magnetic storage devices is typically arranged in an interleaved format. Interleaving is often used to spread the consecutive error bits or symbols into different interleaves which can each be corrected individually. Because interleaving allows the same hardware decoder core to process multiple interleaves repeatedly, interleaving is a cost effective technique to effectively combat burst errors.

Conventional interleaved coding techniques, however, are not without their shortcomings. For instance, interleaved code words have the same number of redundant check symbols and thus possess the same error correction capability. It has been observed that random errors may concentrate in one or two interleaves instead of substantially all interleaves. This concentration of random errors serves to defeat the effectiveness of providing redundant check symbols in each interleaved code word. Based upon the foregoing, there exists a need for a system and method for efficiently providing an error correction coding scheme that is tailored to correcting errors typically encountered in a magnetic storage medium.

SUMMARY OF THE INVENTION

The present invention overcomes shortcomings in prior systems and satisfies a significant need for providing an error correction code having a selectively variable redundancy. The system selectively provides additional check symbols to increase the power of uncorrectable interleaved code words without a substantial increase in overhead.

With conventional variable redundancy Reed-Solomon error correction techniques, only some of the check symbols that are generated form part of an interleaved code word and thus provide redundancy. Unused check symbols are typically discarded. In a preferred embodiment of the present invention, a programmable number of extended check symbols are generated from the unused check symbols. Each extended check symbol is formed by performing a Reed-Solomon encoding operation on each unused check symbol in a column of the unused check symbols. Extended check symbols are organized into one or more sets of extended check symbols. The number of sets of extended check symbols is based upon the order of the Reed-Solomon generator polynomial utilized in forming the extended check symbols. The number of extended check symbol sets is limited both by the amount of additional overhead available and by the number of unused check symbols per interleave.

The one or more sets of the extended check symbols are stored in memory with the corresponding interleaved code words.

In addition to the preferred embodiments of the present invention including system software and associated hardware for encoding the extended check symbols, the preferred embodiments of the present invention also selectively decode the extended check symbols as needed based upon the identification of uncorrectable interleaved code words during a conventional decode operation of the interleaved code words. In particular, following the conventional interleave decoding operation, the extended check symbols are selectively decoded upon the affirmative determination that the number of uncorrectable interleaved code words is less than or equal to the number of sets of extended check symbols. The decoding recovers the unused check symbols that were used to generate the extended check symbols. The unused check symbols, when added to the previous uncorrectable interleaved code words, increase the number of check symbols available for correcting the previously uncorrectable errors therein. Following modification of partial syndromes to take into account the unused check symbols, the previously uncorrectable interleaved code words are decoded a second time with the recovered unused check symbols now being part of the uncorrectable interleaved code words. In this iterative decoding technique, the check symbols of the uncorrectable interleaved code words are selectively increased so as to increase the error correcting capability of the previously uncorrectable interleaved code words, without a significant increase in overhead.

Instead of generating a single layer of extended check symbols, in a second preferred embodiment of the present invention two or more layers of extended check symbols are created. The number of sets of extended check symbols in each layer of extended check symbols may be distinct. Further, the extended check symbols in each layer of extended check symbols are generated from different columns of the unused check symbols. In decoding the interleaved code words, the system software and associated hardware will sequentially decode the extended check symbols from different layers of extended check symbols until all of the uncorrectable interleaved code words which can be corrected due to the extended check symbols have been corrected.

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION OF THE PREFERRED EXEMPLARY EMBODIMENTS

Figure 1:
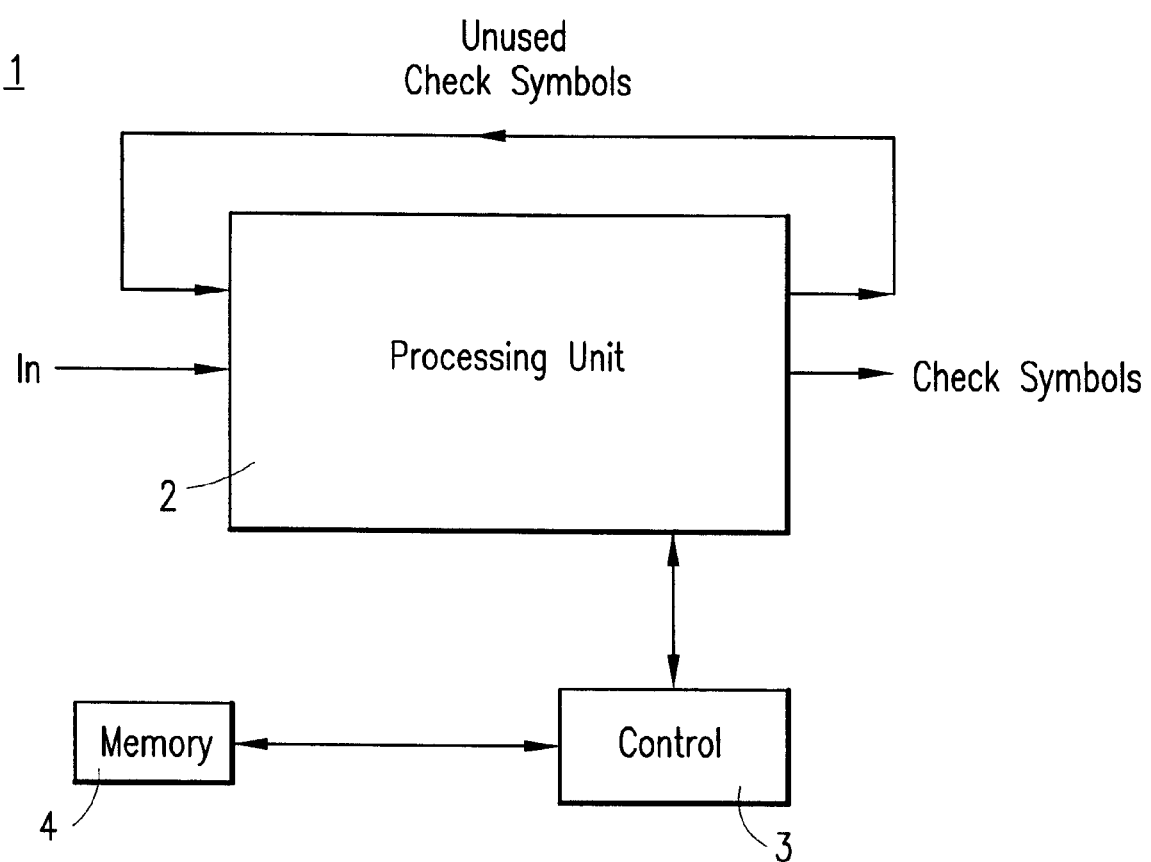
FIG. 1 is a function block diagram of a computing system according to the preferred embodiments of the present invention.

Referring to FIG. 1, there is shown a control system 1 according to a preferred embodiment of the present invention. Control system 1 may be part of a data storage system, such as a hard disk controller of a hard disk drive. In general terms, control system 1 is adapted to provide redundancy for performing error correction that is selectively varied depending upon the amount of redundancy necessary to correct what would otherwise be considered uncorrectable errors in data stored in the data storage system.

According to the preferred embodiments of the present invention, control system 1 may be implemented with a processing element 2 for encoding and decoding check symbols using a Reed-Solomon error correction algorithm. Control system 1 may further include a control unit 3 which configures processing element 2 to perform encoding and decoding operations. Memory 4 preferably stores system software which may be utilized by control unit 3 in controlling processing element 2 to perform encoding and decoding operations according to the preferred embodiments of the present invention.

As stated above, conventional variable redundancy error correction coding may use only a portion of the total check symbols generated. Any unused check symbols are discarded and thus do not contribute to the error correction capability of the conventional coding system. In contrast, processing element 2 of the preferred embodiments of the present invention creates extended check symbols by encoding the unused check symbols. For example, processing element 2 is controlled by control unit 3 to perform a Reed-Solomon encoding operation on the unused check symbols to generate the extended check symbols. The extended check symbols may be selectively decoded as needed to increase the error correction capability of an interleaved code word having one or more errors therein.

The present invention will be described below as providing error correction to a five way interleaved coding structure for exemplary reasons only. It is understood that the present invention may be used in association with any interleaved coding structure.

Figure 2:
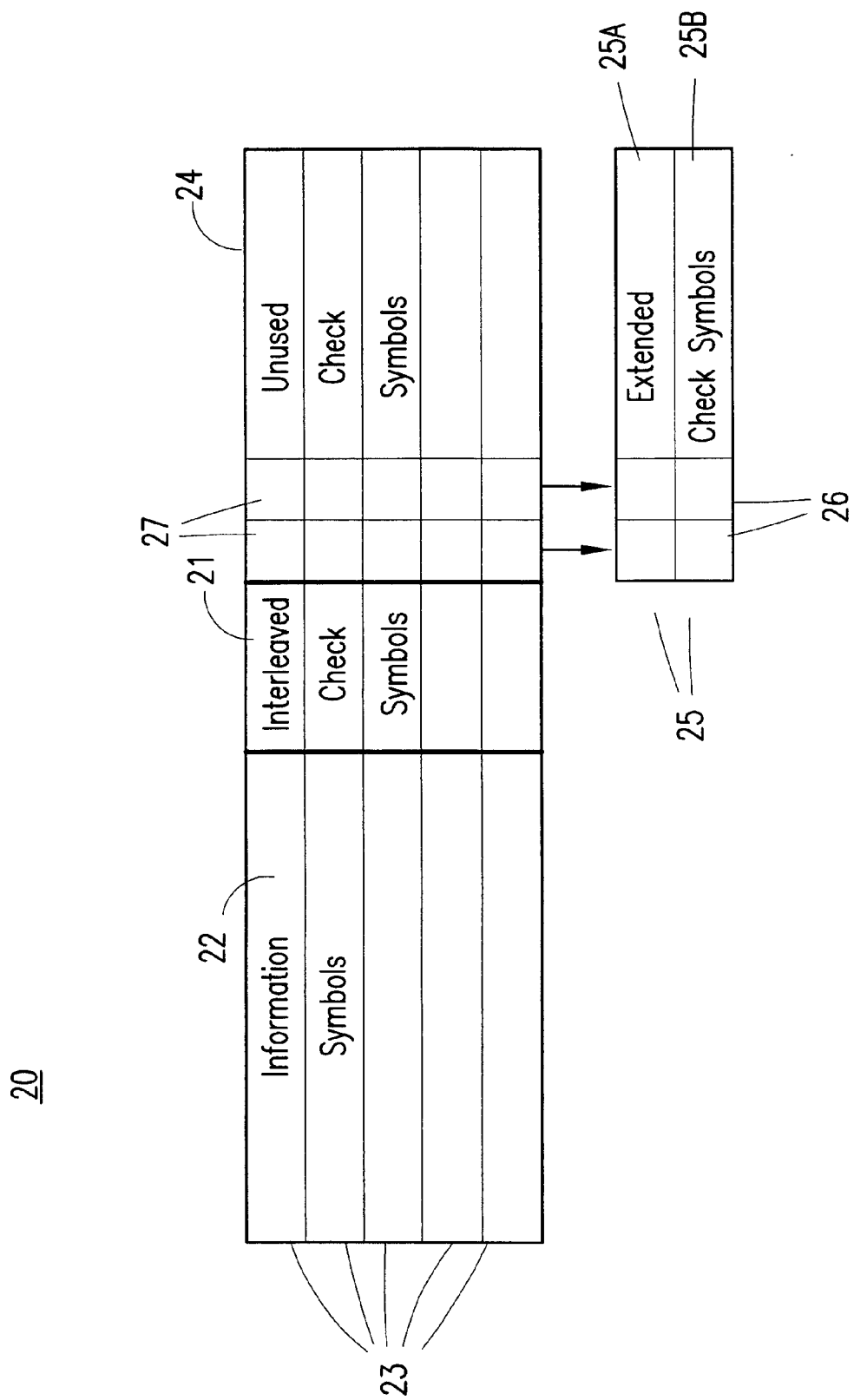
FIG. 2 is a diagram illustrating an interleaved coding pattern according to a first preferred embodiment of the present invention.

FIG. 2 illustrates a five way interleaved coding pattern 20 generated by control system 1 according to a first preferred embodiment of the present invention. Control system 1 generates interleaved check symbols 21 that are combined with information symbols 22 to form interleaved code words 23. In generating interleaved check symbols 21, control system 1 further generates unused check symbols 24 that are conventionally discarded and are not utilized to perform error correction. Control system 1 generates one or more sets 25 of extended check symbols 26 using a Reed-Solomon coding operation. In particular, an extended check symbol 26 is generated from each unused check symbol from a single column 27 of unused check symbols 24.

The number of sets 25 of extended check symbols 26 is dependent upon the degree of the Reed-Solomon generator polynomial used in generating the extended check symbols 26. For example, a single set 25 of extended check symbols 26 is generated by using a first degree generator polynomial $(x+\alpha^0)$. In other words, for a single set 25 of extended check symbols 26, an extended check symbol 26 is formed by performing a boolean exclusive-OR (XOR) operation on the unused check symbols 24 in a column 27 of unused check symbols 24. By performing a similar 'XOR' operation on the unused check symbols 24 in other columns 27 of unused check symbols 24, a complete set 25 of extended check symbols 26 may be generated.

In a second example, two sets 25 of extended check symbols 26 may be generated using the second degree generator polynomial $(x+\alpha^0)(x+\alpha^1)$. In particular, an extended check symbol 26 may be created for each set 25 by performing a Reed-Solomon operation using the second degree generator polynomial on the unused check symbols in a single column 27. More specifically, the two extended check symbols 26 corresponding to a column 27 of unused check symbols 24 are the remainder from performing polynomial division. For instance, consider the extended check symbols 26 in one set 25A being the first degree coefficient of the remainder polynomial and the extended check symbols 26 in the second set 25B being the zero degree coefficient thereof. The transmission order is from top to bottom and then from left to right.

By performing similar Reed-Solomon operations on the unused check symbols 24 in other columns 27, two complete sets 25 of extended check symbols 26 may be generated.

It is understood that other Reed-Solomon polynomials may be utilized to create sets 25 of extended check symbols 26. It is also understood that encoding methods may be utilized to create sets 25 of extended check symbols 26 other than Reed-Solomon operations.

The number of sets 25 of extended check symbols 26 may vary depending upon the particular application, so long as the number is less than the interleaving degree in order to limit the total number of check symbols relative to the number of conventionally used interleaved check symbols 21.

Processing element 2 and control unit 3 of control system 1 store the set(s) 25 of extended check symbols 26 in a data storage device (not shown) along with the corresponding interleaved code words 23.

According to a first preferred embodiment of the present invention, control system 1 retrieves the set(s) 25 of extended check symbols 26 from the data storage device when the corresponding interleaved codes words 23 are retrieved therefrom. Control system 1 decodes the interleaved code words 23 and, generates one or more partial syndromes and determines if uncorrectable errors are encountered during the decoding process. Control system 1 also decodes the corresponding set(s) 25 of extended check symbols 26 based upon the identification of uncorrectable interleaved code words 23 from decoding the interleaved code words 23. Specifically, control system 1 will decode the retrieved extended code symbols 26 to recover unused check symbols 24 for the uncorrectable interleaved code words 23 so long as the number of uncorrectable interleaved code words 23 is no more than the number of sets 25 of extended check symbols 26. The unused check symbols 24 can be recovered from the extended check symbols 26 the same way as any other type of erasures by performing error-and-erasure decoding. The unused check symbols 24 thereafter become available for interleaved code words 23. Control system 1 incorporates the unused check symbols 24 corresponding to the extended check symbols 26 into the uncorrectable interleaved code word 23. In this way, an interleaved code word 23 having previously-identified uncorrectable errors therein is provided with additional redundancy (the unused check symbols 24 corresponding to the extended check symbols 24) so as to improve the likelihood of correcting the previously-identified uncorrectable errors.

In decoding the extended check symbols 26 so as to recover unused check symbols 24, control system 1 is capable of modifying the partial syndromes by generating partial syndromes from the recovered unused check symbols 24. Control system 1 is capable of decoding uncorrectable interleaved code words 23, including the unused check symbols 24, and determining if any uncorrectable errors remain. As can be seen, control system 1 provides an iterative feature in which additional check symbols (unused check symbols 24 corresponding to extended check symbols 26) are provided when needed to correct otherwise uncorrectable errors.

Figure 3:
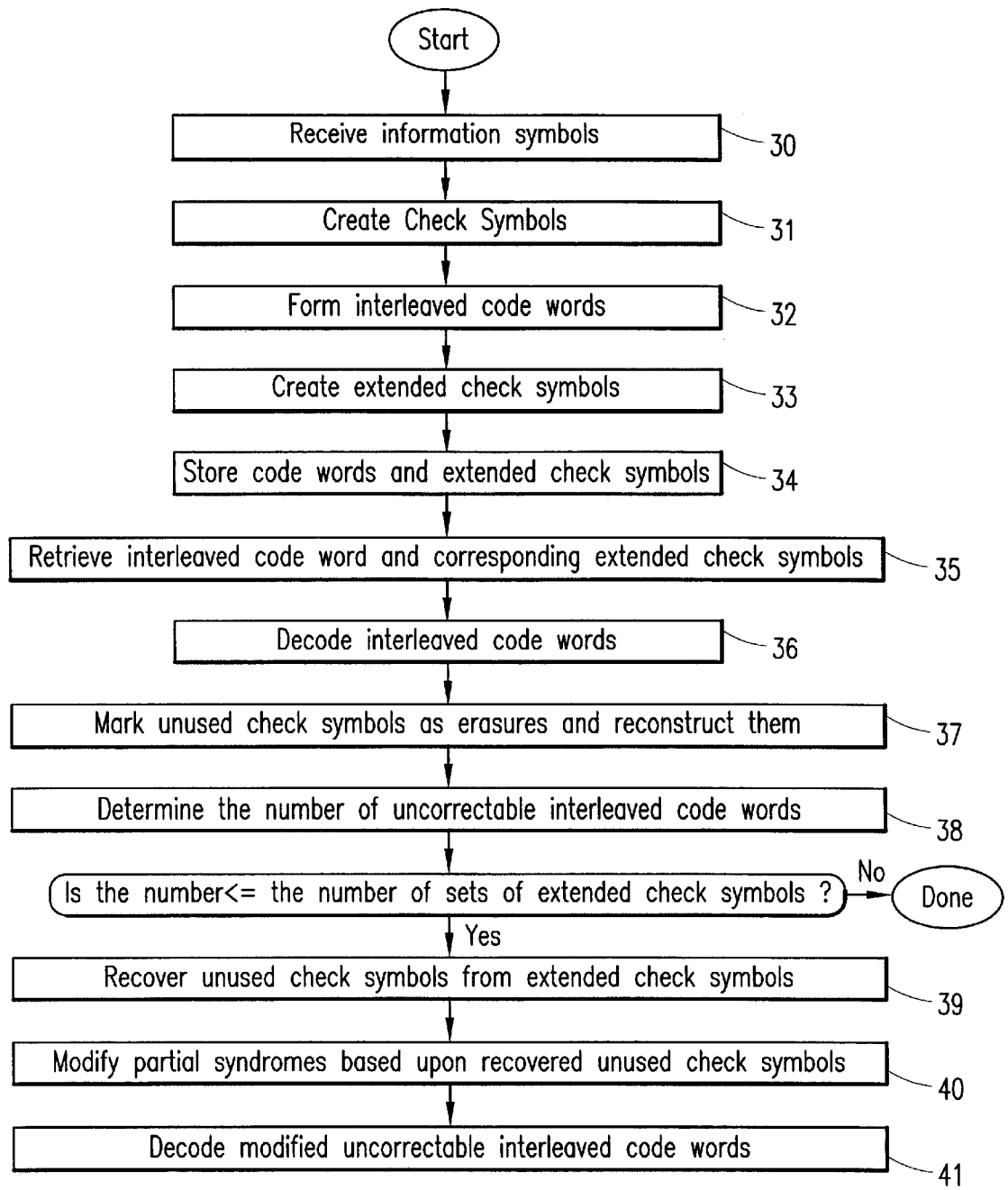
FIG. 3 is a flow chart illustrating an operation of the first preferred embodiment of the present invention.

The operation of the present invention according to the first preferred embodiment thereof will be described with reference to FIG. 3. Initially, it is assumed that the number of sets 25 of extended check symbols 26 has been preselected and stored in system software in memory 4 of control system 1. When information symbols (i.e., data) to be stored in the data storage device (not shown) is received by control system 1 at step 30, check symbols are generated at step 31. One group of generated check symbols form interleaved check symbols 21 that are combined at step 32 with the information symbols so as to form the interleaved code words 23. Some of the remaining or unused check symbols 24 can be used by control system 1 to generate extended check symbols 26 at step 33. The extended check symbols 26 are created by using a Reed-Solomon generator polynomial of an order which matches the preselected number of sets 25 of extended check symbols 26 that are desired. The resulting Reed-Solomon operation is performed on the unused check symbols 24 in selected columns 27 so as to create an extended check symbol 26 for each set 25. Following creation of the set(s) 25 of extended check symbols 26, the interleaved code words 23 and corresponding extended check symbols 26 are stored in memory at step 34.

When the stored information (data) symbols are needed, the interleaved code words 23 therefor and the corresponding extended check symbols 26 are retrieved from memory at step 35. Next, the conventional interleave decoding is performed on the interleaved code words 23 at step 36. During the decoding operation, the unused check symbols 24 of corrected interleaved code words 23 are reconstructed by marking them as erasures at step 37. Part of this error-and-erasure decoding includes creating partial syndromes from the information symbols 22 and the interleaved check symbols 21 and modifying the partial syndromes to account for the unused check symbols 24. From this, uncorrectable errors in the interleaved code words 23 may be identified at step 38.

In the event that the number of uncorrectable interleaved code words 23 is no more than the number of sets 25 of extended check symbols 26, the unused check symbols 24 corresponding to the extended check symbols 26 are recovered at step 39. The recovery of the unused check symbols 24 is performed by solving a simple set of one or more linear equations. The number of linear equations to be solved matches the number of uncorrectable interleaved code words 23.

For instance assume only one set of extended check symbols 26 was created. Consequently, for each extended check symbol 26 and corresponding column of unused check symbols 24, a simple XOR operation may be used to determine/generate the unused check symbol 24 for the uncorrectable interleaved code word 23.

For an implementation utilizing two sets 25 of extended code words 26, unused check symbols 24 may be recovered for up to two uncorrectable interleaved code words 23 by solving two linear equations. For each column 27 used in generating extended check symbols 26, the parity check matrix for a five way interleave configuration represented as $$\begin{matrix} 1 & 1 & 1 & 1 & 1 & 1 & 1 \\ 1 & \alpha^1 & \alpha^2 & \alpha^3 & \alpha^4 & \alpha^5 & \alpha^6 \end{matrix}$$

may be used to determine the unused check symbols 24 for the uncorrectable interleaved code words 23. For example, if the unused check symbols 24 from a single column 27 may be represented as a vector

[c0, c1, c2, c3, c4, c5, c6], it can be seen that the two linear equations using the parity check matrix are $c0+c1+c2+c3+c4+c5+c6=0$, and $c0+c1*\alpha^1+c2*\alpha^2+c3*\alpha^3+c4*\alpha^4+c5*\alpha^5+c6*\alpha^6=0$ These linear equations can be easily solved to determine any two unused check symbols 24 (any two c variables) along a given column of unused check symbols 24. This recovery procedure is performed for each column 27 of unused check symbols 24 and their corresponding bits of extended check symbols 26 until all of the unused check symbols 24 for the uncorrectable interleaved code words 23 have been recovered from the extended check symbols 26.

It is understood that other matrices and/or decoding equations may be utilized based upon the particular Reed-Solomon operation or other encoding operation utilized in step 63.

Following the recovery of all possible unused check symbols 24 in incorrectable interleaved code words 23 from extended check symbols 26 and the reconstructed unused check symbols 24 in corrected interleaved code words 23, the partial syndromes of previously uncorrectable interleaved code words 23 generated during decoding step 36 are modified at step 40 to account for the recovered unused check symbols 24. The partial syndromes may be modified by generating partial syndromes from the recovered unused check symbols 24 as if the recovered unused check symbols 24 were retrieved from the data storage device.

Because the recovered unused check symbols 24 are at the lowest order locations of the previously uncorrectable interleaved code word 23, the original partial syndromes can be modified as if the recovered unused check symbols 24 had just been provided following the receipt of the interleaved code words from the data storage device.

For instance, let g(x) be the generator polynomial of the interleaved Reed-Solomon code so that $$g(\alpha^{m0})=g(\alpha^{m0+1})=g(\alpha^{m0+2})=\ldots=g(\alpha^{m0+c-1})=0$$

The partial syndrome modifications are performed by using the following equation:

$$S_j = S_j * \alpha^{m0+j} + C_k,$$

where $C_k$ represents the recovered unused check symbol 24. For every $C_k$ in the previously uncorrectable interleaved code word 23, the equation is evaluated recursively for every partial syndrome. In this way, every partial syndrome is modified as many times as the number of extended check symbols 26 per set 25.

Subsequent modification of the partial syndromes involves leftover unused check symbols 24. Because some of the unused check symbols 24 have been recovered, the number of leftover unused check symbols 24 is reduced by the number of extended check symbols 26 per set 25.

At this point, the recovered unused check symbols 24 form part of the uncorrectable interleaved code words 23, thereby substantially increasing the error correcting capability of the interleaved code words 23 that were previously identified as being uncorrectable. Thereafter, the previously uncorrectable interleaved code words 23 may be decoded at step 41. With the previously uncorrectable interleaved code words 23 now having increased redundancy, the capability of correcting any errors therein has substantially improved.

For conventional interleave decoding, the last interleaved check symbol is the location 0 while the first received data has the highest location address. However, because of the extended check symbol decoding, the address calculation is offset by the unused check symbols 24 recovered thereby. To form a stronger interleaved code word 23 having the recovered unused check symbols 24, the last recovered unused check symbols 24 are assigned location 0 as opposed to the last interleaved check symbol 21.

This address offset causes erasure locations in the interleaved address domain to be offset by the number of extended check symbols 26 per set 25. Further, the address offset causes the legitimate error range in a Chien search algorithm to be increased by the number of extended check symbols 26 per set 25. Moreover, the address offset causes the interleave address conversion to a sector address to be offset by the number of extended check symbols 26 per set 25. If the errors or erasures occur in the extended check symbols 26, the address conversion equation is modified and errors are not corrected in buffer memory.

As can be seen, the error correcting capability of interleaved code words having uncorrectable errors therein may be selectively enhanced with very little overhead (the generation and storage of extended check symbols 26).

In the first embodiment of the present invention illustrated by FIG. 2, a single layer of extended check symbols 26 is created in order to enhance the error correcting capability of uncorrectable interleaved code words 23, by selectively generating unused check symbols 24 from the extended check symbols 26. Even greater flexibility in generating unused check symbols 24 may be provided by utilizing a plurality of layers.

Figure 4:
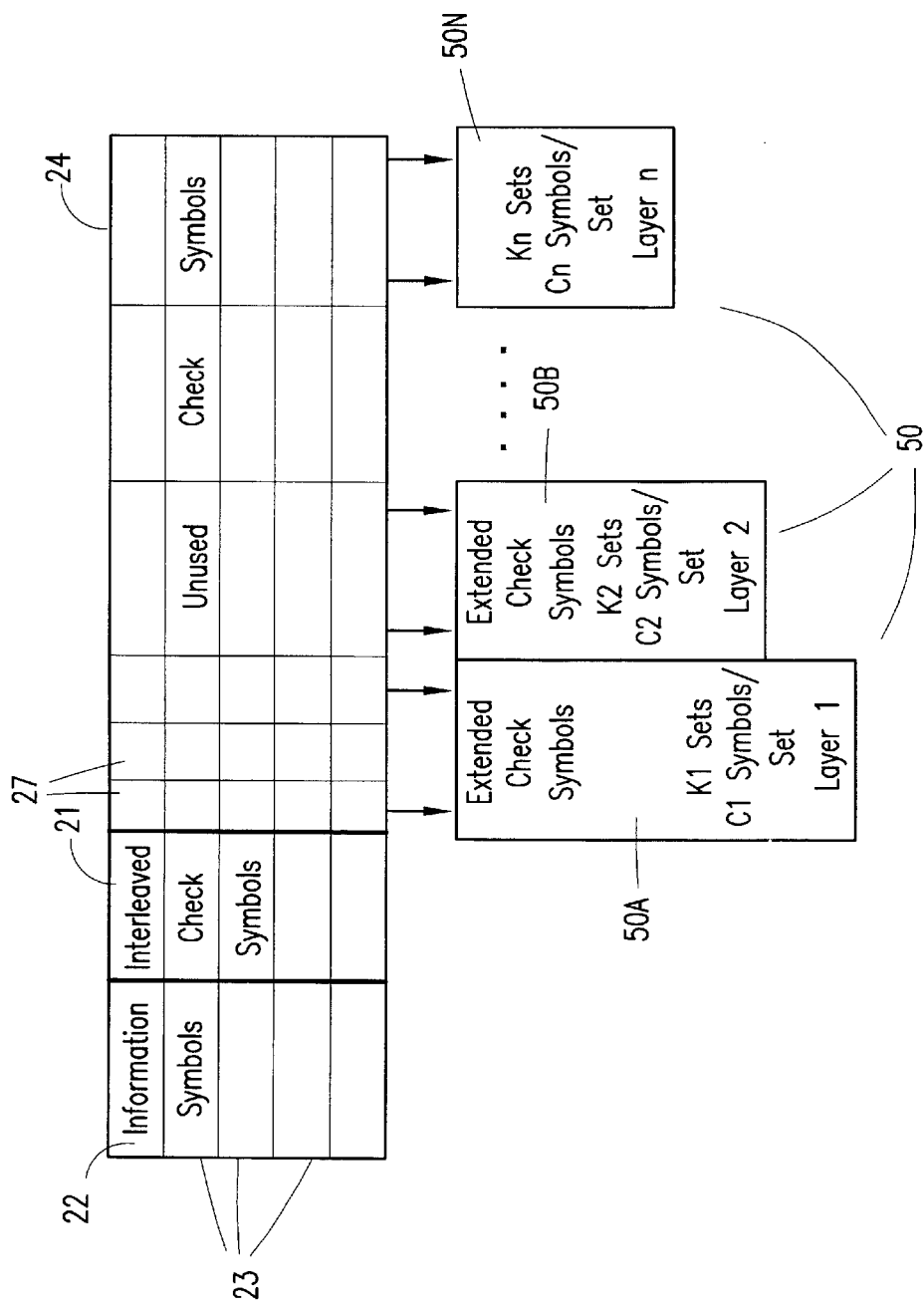
FIG. 4 is a diagram illustrating an interleaved coding pattern according to a second preferred embodiment of the present invention.

Correspondingly, a second preferred embodiment of the present invention utilizes two or more layers 50 of extended check symbols 26. In this embodiment, a layer 50 of extended check symbols 26 is generated from distinct columns 27 of unused check symbols 24. As shown in FIG. 4, extended check symbols 26 of layer 50A are generated from a first set of columns 27 of unused check symbols 24, extended check symbols 26 of layer 50B are generated from a second set of columns 27 of unused check symbols 24, and extended check symbols 26 of layer 50N are generated from an nth set of columns 27 of unused check symbols 24. Within each layer 50, the extended check symbols 26 in each set 25 is the same. The number of sets and the number of extended check symbols 26 therewithin may vary between different layers 50.

The extended check symbols 26 within each layer 50 are generated using similar generator polynomials described above with respect to the first preferred embodiment of the present invention. The Reed-Solomon code generator polynomial for each column of unused check symbols 27 may be represented by $$g(x) = \prod_{i=o}^{k_n-1} (x + \alpha^i)$$

where $k_n$ is the number of sets of extended check symbols 26 for a layer n.

In general terms, processing element 2 and control unit 3 sequentially recover unused check symbols 24 for uncorrectable interleaved code words 23 from layers 50 based upon the errors in the previously correctable interleaved code words 23.

Figure 5:
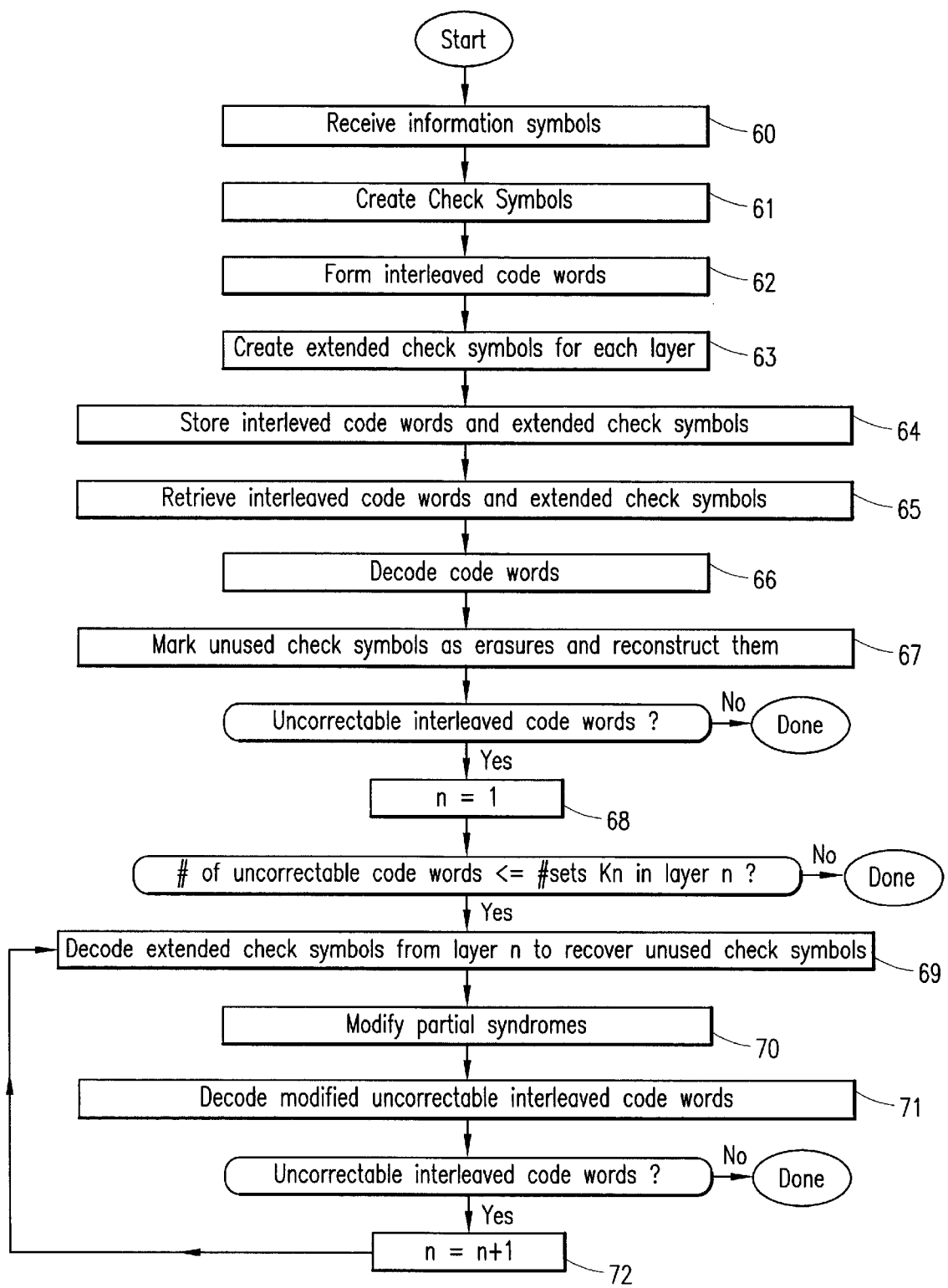
FIG. 5 is a flow chart illustrating an operation of the second preferred embodiment of the present invention.

The operation of the second preferred embodiment of the present invention will be described with reference to FIG. 5. The first few steps in the operation substantially match the first steps of the operation of the first embodiment of the present invention. Information symbols are received at step 60 and check symbols generated therefrom at step 61. Interleaved code words 23 are formed at step 62 using the information symbols 22 and the interleaved check symbols 21. Extended check symbols 26 are generated from unused check symbols 24 at step 63 for layers 50. For each layer 50, the extended check symbols 26 are generated using a Reed-Solomon generator polynomial $$g(x) = \prod_{i=o}^{k_n-1} (x + \alpha^i)$$

as described above. The interleaved code words 23 and the extended check symbols 26 are stored in a data storage device at step 64.

The extended check symbols 26 are retrieved from the data storage device at step 65 when the corresponding interleaved code words 23 are retrieved therefrom. The interleaved code words 23 are decoded in the conventional manner at step 66. During the conventional decoding, the unused check symbols 24 are marked as erasures at step 67. The unused check symbols 24 can be recovered the same way as a true erasure can be recovered by performing error-and-erasure decoding as long as the interleaved code words 23 are correctable.

If there are no identified uncorrectable interleaved code words 23, then the decoding is complete. However, if there are one or more uncorrectable interleaved code words 23, a variable n is initialized to 1 at step 68. If the number of uncorrectable interleaved code words 23 is greater than the $k_n$ number of sets 25 of extended check symbols 26 in layer n and noting that frame 1 has the greatest number of sets 25, then the uncorrectable interleaved code words 23 are declared and error correction ceases.

However, in the event that the number of uncorrectable interleaved code words 23 is not greater than the $k_n$ number of sets 25 of extended check symbols 26 in layer n, then the extended check symbols 26 from layer n are decoded at step 69 in order to recover the unused check symbols 24 associated with the extended check symbols 26. The unused check symbols 24 are recovered by solving $k_n$ linear equations as described above with respect to the first preferred embodiment of the present invention. The partial syndromes of the uncorrectable interleaved code words 23, which were generated during the conventional decoding step (step 66), are modified to take into account the recovered unused check symbols 24. The partial syndromes are updated in the same manner as described above with respect to the first embodiment of the present invention. At this point, the check symbols for the previously uncorrectable interleaved code words 23 have been increased so as to provide enhanced error correction capability. The previously uncorrectable interleaved code words 23 are decoded at step 71 and any remaining uncorrectable interleaved code words 23 identified. If no uncorrectable interleaved code words remain, the decoding/error correction ceases. However, if uncorrectable interleaved code words 23 remain, variable n is incremented at step 72 and steps 69, 70 and 71 are repeated to execute another iteration of error correction of previously uncorrectable interleaved code words 23, with the previously uncorrectable interleaved code words 23 having even more check symbols. In this way, steps 69–72 are repeated until uncorrectable errors no longer exist, the unused check symbols 24 for every frame 50 have been provided to the uncorrectable interleaved code words 23, or the uncorrectable errors are determined to be uncorrectable.

A variation of the second embodiment of the present invention utilizes the same generator polynomial g(x), the highest degree generator polynomial, to generate the extended check symbols 26 for each layer 50. For layers 50 other than the layer 50A (the layer having the largest number of sets of extended check symbols 26), some of the extended check symbols 26 that are encoded are not subsequently stored with the corresponding interleaved code words 23 at step 64. For a layer n, $k_n$ sets 25 of extended check symbols 26 of a possible $k_1$ sets are stored in memory, leaving the remaining $(k_1-k_n)$ extended check symbol sets 25 unstored. During the decoding operation, the $(k_1-k_n)$ sets 25 of virtual extended check symbols 26 as well as the unused check symbols 24 corresponding to the uncorrectable interleaved code words 23 are marked as erasures and reconstructed using conventional error-and-erasure decoding to recover the unused check symbols 24 at step 69.

A primary advantage of the above-described variation of the second preferred embodiment is that the same generator polynomial is used for each layer 50 of extended check symbols 26, thereby reducing hardware complexity. A disadvantage of this variation of the second embodiment is that the iterations and/or computations necessary to recover the unused check symbols 24 during step 69 increases.

Figure 6:
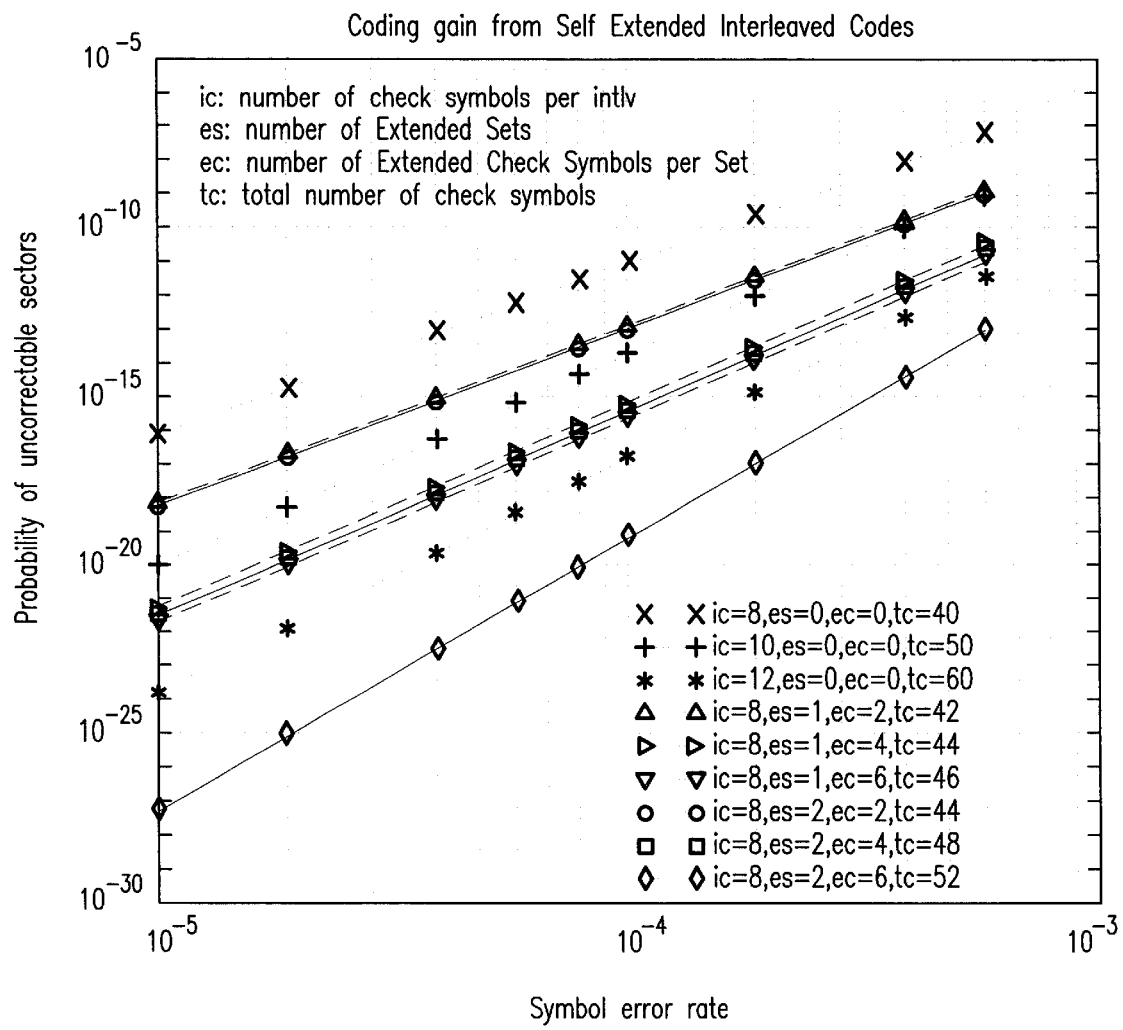
FIG. 6 is a graph of the coding gain from use of the present invention relative to conventional error correction coding techniques.

The results of the present invention in improving the error correction capability is shown in FIG. 6. FIG. 6 is a graph of the probability of uncorrectable sectors versus symbol error rate for a five way interleave structure. Plots from nine different coding configurations are displayed in FIG. 6, including three conventional interleaved coding structures with eight, ten and twelve check symbols per interleave (identified by 'x', '+' and '*' symbols), and six coding configurations utilizing various extended check symbols according to the present invention (identified by diamonds, triangles, circles and squares). Given a target uncorrectable sector rate of 1e-12, it is significant to point out that a redundancy savings of eight symbols is achieved by adding one set 25 of two extended check symbols 26 at symbol error rate 8e-5; adding one set of four extended check symbols 26 to an eight symbols per interleaved code word results in a savings of six check symbols relative to the ten symbols per interleave conventional technique at symbol error rate 2e-4; and adding two sets 25 of six extended check symbols 26 for an eight check symbol per interleave saves eight symbols compared with a twelve symbols per interleave conventional technique.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for correcting errors in data using interleaved Reed-Solomon coding, comprising the steps of:

generating check symbols from received information symbols;

forming interleaved code words from the information symbols and a first group of the check symbols;

generating at least one set of extended check symbols from a second group of the check symbols that do not form a portion of the interleaved code words;

storing the interleaved code words and the extended check symbols in memory without the second group of check symbols;

retrieving the interleaved code words and extended check symbols from memory;

decoding the retrieved interleaved code words;

identifying one or more uncorrectable retrieved interleaved code words based upon the step of decoding;

recovering the second group of check symbols from the retrieved extended check symbols corresponding to the uncorrectable interleaved code words in response to the step of identifying, the one or more uncorrectable retrieved interleaved code words and the corresponding second group of check symbols forming one or more extended interleaved code words; and decoding the one or more extended interleaved code words following the step of decoding the second group of check symbols.

2. The method of claim 1, wherein the step of generating at least one set of extended check symbols comprises the step of:

generating each extended check symbol from a distinct column of check symbols in the second group of check symbols.

3. The method of claim 1, wherein the step of generating at least one set of extended check symbols comprises the step of:

encoding an extended check symbol from a check symbol corresponding to each interleaved codeword, the check symbols being from the second group of check symbols.

4. The method of claim 3, wherein the step of generating at least one set of extended check symbols comprises the step of:

performing a Reed-Solomon operation on the check symbols from the second group of check symbols.

5. The method of claim 1, wherein:

each extended check symbol is generated during the step of generating at least one set of extended check symbols from a distinct column of check symbols in the second group of check symbols.

6. The method of claim 1, wherein the step of generating at least one set of extended check symbols comprises the step of:

generating a plurality of sets of extended check symbols from the second group of check symbols.

7. The method of claim 6, wherein:

an extended check symbol from each set of extended check symbols is generated from the same column from the second group of check symbols.

8. The method of claim 6, wherein:

for each column in the second group of check symbols, an extended check symbol from each set of extended check symbols is generated by performing a Reed-Solomon operation on the check symbols in the column.

9. The method of claim 1, wherein:

the second group of check symbols is decoded upon an affirmative determination that the number of uncorrectable interleaved code words is no more than the number of sets of extended check symbols.

10. The method claim 1, wherein:

the step of identifying uncorrectable interleaved code words includes the step of computing one or more partial syndromes; and the method further comprises the step of modifying the one or more partial syndromes based upon second group of check symbols following the step of identifying uncorrectable interleaved code words.

11. The method of claim 1, wherein:

the step of generating at least one set of extended check symbols comprises the step of generating a plurality of sets of extended check symbols from the second group of check symbols, the sets of extended check symbols being grouped into layers;

the step of recovering comprises the step of recovering check symbols from the second group of check symbols corresponding to a single layer; and the method further comprises the step of repeating the steps of recovering check symbols corresponding to a single layer and decoding the extended interleaved code words upon an affirmative determination that uncorrectable extended interleaved code words exist following the step of decoding the extended interleaved code words, each step of recovering check symbols recovers check symbols from the second group corresponding to a distinct layer.

12. The method of claim 11, wherein:

the sets of extended check symbols from each layer are derived from distinct columns of the second group of check symbols.

13. The method of claim 1, wherein the memory is a magnetic disk.

14. A computer program product including a computer readable medium having computer readable program code means embodied thereon, for correcting errors in data stored in data memory, the computer program product comprising:

first computer readable program code means for generating check symbols from received information symbols;

second computer readable program code means for forming interleaved code words from the information symbols and a first group of the check symbols;

third computer readable program code means for generating at least one group of extended check symbols from a second group of the check symbols that do not form portions of the interleaved code words;

fourth computer readable program code means for storing the interleaved code words and the extended check symbols in memory without the second group of check symbols;

fifth computer readable program code means for retrieving the interleaved code words and extended check symbols from memory;

sixth computer readable program code means for decoding the retrieved interleaved code words;

seventh computer readable program code means for identifying uncorrectable interleaved code words based upon the sixth computer readable program code means;

eighth computer readable program code means for recovering the second group of check symbols from the extended check symbols, the retrieved uncorrectable interleaved code words and the corresponding recovered second group of check symbols forming extended interleaved code words; and ninth computer readable program code means for decoding the extended interleaved code words following the recovering of formation of the extended interleaved code word.

15. The computer program product of claim 14, wherein:

the third computer readable program codes means generates each extended check symbol from a distinct column of check symbols in the second group of check symbols.

16. The computer program product of claim 14, wherein:

the third computer readable program codes means encodes an extended check symbol from a check symbol corresponding to each interleaved codeword, the check symbols being from the second group of check symbols.

17. The computer program product of claim 14, wherein:

the third computer readable program codes means performs a Reed-Solomon operation on the check symbols from the second group of check symbols.

18. The computer program product of claim 14, wherein:

each extended check symbol is generated from a distinct column of check symbols in the second group of check symbols.

19. The computer program product of claim 14, wherein:

the third computer readable program code means generates a plurality of sets of extended check symbols from the second group of check symbols.

20. The computer program product of claim 14, wherein:

an extended check symbol from each set of extended check symbols is generated from the same column from the second group of check symbols.

21. The computer program product of claim 14, wherein:

for each column in the second group of check symbols, an extended check symbol from each set of extended check symbols is generated by performing a Reed-Solomon operation on the check symbols in the column.

22. The computer program product of claim 14, wherein:

the second group of check symbols is decoded upon an affirmative determination that the number of uncorrectable interleaved code words is no more than the number of sets of extended check symbols.

23. The computer program product of claim 14, wherein:

the seventh computer readable program code means computes one or more partial syndromes; and the computer program product further comprises a tenth computer readable program code means for modifying the one or more partial syndromes based upon second group of check symbols following the identification of the uncorrectable interleaved code words.

24. The computer program product of claim 14, wherein:

the sets of extended check symbols from each layer are derived from distinct columns of the second group of check symbols.

25. The computer program product of claim 14, wherein:

the third computer readable program code means generates a plurality of sets of extended check symbols from the second group of check symbols, the sets of extended check symbols being grouped into layers; and the eighth computer readable program code means sequentially recovers the check symbols from the second group of check symbols corresponding to a single layer at a time.

26. The computer program product of claim 14, wherein the memory is a magnetic disk.

27. A computer program product including a computer readable medium having computer readable program code means embodied thereon, for correcting errors in data stored in data memory, the computer program product comprising:

first computer readable program code means for retrieving interleaved code words and extended check symbols from memory;

second computer readable program code means for decoding the interleaved code words;

third computer readable program code means for identifying uncorrectable interleaved code words based upon the decoding by the second computer readable program code means;

fourth computer readable program code means for generating first check symbols relating to the uncorrectable interleaved code words from the extended check symbols in response to the decoding, the first check symbols being added to the uncorrectable interleaved code words to form extended interleaved code words; and fifth computer readable program code means for decoding the extended interleaved code words following the first check symbols being added to the uncorrectable interleaved code words.

28. The computer program product of claim 27, further comprising:

sixth computer readable program code means for selectively generating second check symbols relating to the uncorrectable interleaved code words from the extended check symbols in response to the third computer readable program code means, the second check symbols being added to the uncorrectable interleaved code words; and wherein the fifth computer readable program code means decodes the uncorrectable interleaved code words following the first and second check symbols being added to the uncorrectable interleaved code words.

29. The computer program product of claim 27, wherein the memory is a magnetic disk.

30. A method for correcting errors in data using interleaved Reed-Solomon coding, comprising the steps of:

retrieving interleaved code words and corresponding extended check symbols from memory, the interleaved code words having interleaved check symbols;

decoding the interleaved code words;

identifying one or more uncorrectable interleaved code words having one or more uncorrectable errors based upon the step of decoding;

generating, from the extended check symbols, first check symbols relating to the one or more uncorrectable interleaved code words following the step of identifying, the first check symbols being added to the one or more uncorrectable interleaved code words to form one or more extended interleaved code words; and decoding the one or more extended interleaved code words following the step of generating.

31. The method of claim 30, further comprising modifying, prior to the step of decoding the one or more uncorrectable interleaved code words, partial syndromes of the one or more uncorrectable code words.

32. The method of claim 30, wherein the step of generating comprises performing a Reed-Solomon operation on the extended check symbols to generate the first check symbols.

33. The method of claim 30, wherein:

the extended check symbols form a first set of extended check symbols;

the step of retrieving comprises retrieving a second set of extended check symbols;

the method further comprises:

identifying, following the step of decoding the one or more extended interleaved code words, an extended interleaved code word having at least one uncorrectable error;

generating, from the second set of extended check symbols, second check symbols relating to the extended interleaved code word having the at least one uncorrectable error, the second check symbols being added to the extended interleaved code word having the at least one uncorrectable error to form a doubly extended interleaved code word; and decoding the doubly extended interleaved code word.

34. The method of claim 33, wherein the number of extended check symbols from the first set of extended check symbols is greater than the number of extended check symbols from the second set of extended check symbols.

35. The method of claim 30, wherein the memory is a magnetic disk.

36. An apparatus for coding information, comprising:

a processing unit operable to generate a first group and a second group of check symbols from received information symbols, form interleaved code words using the information symbols and the first group of check symbols without the, check symbols from the second group, generate at least one set of extended check symbols from the second group of check symbols, and store the interleaved code words and the extended check symbols in memory without storing the second group of check symbols;

wherein the processing unit is further operable to retrieve the interleaved code words and the extended chock symbols from memory, decode the retrieved interleaved code words, identify one or more retrieved interleaved code words as having an uncorrectable error, recover at least some of the second group of check symbols from the retrieved extended check symbols, form one or more extended interleaved code words from the one or more retrieved interleaved code words having an uncorrectable error and the recovered second group of check symbols, and decode the extended interleaved code words.

37. The apparatus of claim 36, wherein the extended check symbols are generated by the processing unit from at least one selected column of check symbols in the second group of check symbols.

38. The apparatus of claim 37, wherein the processing unit generates at least two sets of extended check symbols, an extended check symbol from each set of extended check symbols are generated from the same selected column of check symbols from the second group of check symbols.

39. The apparatus of claim 36, wherein the memory is a magnetic disk.

40. The apparatus of claim 36, wherein the processing unit recovers at least some of the second group of check symbols from the retrieved extended check symbols and reconstructed unused check symbols from corrected interleaved code words.

41. A computer software product embodying program instructions for execution by a processing unit for retrieving information from a memory, the computer software product including instructions stored on a computer medium which, when executed by the processing unit, operate to:

retrieve interleaved code words and corresponding extended check symbols from memory, the interleaved code words having interleaved check symbols;

decode the interleaved code words;

identify one or more uncorrectable interleaved code words having one or more uncorrectable errors based upon the decoding;

generate, from the extended check symbols, first check symbols relating to the one or more uncorrectable interleaved code words following the step of identifying, the first check symbols being added to the one or more uncorrectable interleaved code words to form one or more extended interleaved code words; and decode the one or more extended interleaved code words following the generating.

42. The computer software product of claim 41, further comprising instructions for modifying, prior to the decoding the one or more uncorrectable interleaved code words, partial syndromes of the one or more uncorrectable code words.

43. The computer software product of claim 41, wherein the instructions for generating comprises instructions for performing a Reed-Solomon operation on the extended check symbols to generate the first check symbols.

44. The computer software product of claim 41, wherein:

the extended check symbols form a first set of extended check symbols;

the retrieving comprises retrieving a second set of extended check symbols;

the computer software product further comprises instructions for:

identifying, following the decoding the one or more extended interleaved code words, an extended interleaved code word having at least one uncorrectable error;

generating, from the second set of extended check symbols, second check symbols relating to the extended interleaved code word having the at least one uncorrectable error, the second check symbols being added to the extended interleaved code word having the at least one uncorrectable error to form a doubly extended interleaved code word; and decoding the doubly extended interleaved code word.

45. The computer software product of claim 44, wherein the number of extended check symbols from the first set of extended check symbols is greater than the number of extended check symbols from the second set of extended check symbols.

* * * * *

UNITED STATES PATENT AND TRADEMARK OFFICE
CERTIFICATE OF CORRECTION

PATENT NO. : 6,606,727 B1
DATED : August 12, 2003
INVENTOR(S) : Honda Yang et al.

It is certified that error appears in the above-identified patent and that said Letters Patent is hereby corrected as shown below:

Column 14,
Line 37, replace "the, check symbols" with -- the check symbols --
Line 44, replace "extended chock" with -- extended check --

Signed and Sealed this

Fourteenth Day of October, 2003

JAMES E. ROGAN
*Director of the United States Patent and Trademark Office*